(12) United States Patent
Wimer

(10) Patent No.: US 7,079,989 B2
(45) Date of Patent: Jul. 18, 2006

(54) ARRANGEMENTS FOR AUTOMATIC RE-LEGGING OF TRANSISTORS

(76) Inventor: Shmuel Wimer, P.O. Box 1659, Haifa 21015 (IL)

( * ) Notice: Subject to any disclaimer, the term of this patent is extended or adjusted under 35 U.S.C. 154(b) by 865 days.

(21) Appl. No.: 09/893,527

(22) Filed: Jun. 29, 2001

(65) Prior Publication Data

US 2003/0005401 A1 Jan. 2, 2003

(51) Int. Cl.
*G06F 17/50* (2006.01)
*G06F 9/45* (2006.01)

(52) U.S. Cl. .............................. 703/1; 716/9
(58) Field of Classification Search ................ 703/1; 716/9
See application file for complete search history.

(56) References Cited

U.S. PATENT DOCUMENTS

| | | | | |
|---|---|---|---|---|
| 5,764,533 A | * | 6/1998 | deDood | 716/8 |
| 5,920,486 A | * | 7/1999 | Beahm et al. | 716/10 |
| 5,984,510 A | * | 11/1999 | Guruswamy et al. | 716/2 |
| 5,987,086 A | * | 11/1999 | Raman et al. | 716/1 |
| 6,006,024 A | * | 12/1999 | Guruswamy et al. | 716/12 |
| 6,209,123 B1 | * | 3/2001 | Maziasz et al. | 716/14 |
| 6,393,601 B1 | * | 5/2002 | Tanaka et al. | 716/2 |
| 6,823,500 B1 | * | 11/2004 | Ganesh et al. | 716/9 |

OTHER PUBLICATIONS

John Valainis, Sinan Kaptanoglu, Erwin Liu, Robert Suaya, "Two-Dimensional IC Layout Compaction Based on Topological Design Rule Checking" IEEE 1990, pp. 260-275.*

Nikolaos G. Bourbakis, Mohammad Mortazavi, "An Efficient Building Block Layout Methodology For Compact Placement" IEEE 1995, pp. 118-123.*

Lack A. Feldman, Israel A. Wagner, Shmuel Wimer, "An Efficient Algorithm for Some Multirow Layout Problems", IEEE 1993, pp. 1178-1185.*

* cited by examiner

Primary Examiner—Paul L. Rodriguez
Assistant Examiner—Dwin M. Craig
(74) Attorney, Agent, or Firm—LeMoine Patent Services, PLLC (57) ABSTRACT

Arrangements for automatic re-legging of transistors.

19 Claims, 8 Drawing Sheets

FIG. 15

ARRANGEMENTS FOR AUTOMATIC RE-LEGGING OF TRANSISTORS

FIELD

The present invention relates to arrangements for automatic re-legging of transistors.

BACKGROUND

Early in the history of the semiconductor industry, integrated circuit (IC) design centers and manufacturers generally designed each generation of silicon circuits from scratch. As disadvantages, designing from scratch requires tremendous resources (financial costs, etc.) and time (e.g., many man-years), and such may now represent unacceptable costs and time-to-market (TtM) product delays. That is, in today's competitive, fast-changing semiconductor market, IC design centers and manufacturers must, for the sake of basic business survival, quickly move to "process shift" IC products from one size technology (e.g., 0.18 µm) to the latest deep-submicron sized technology (e.g., 0.13 µm) to provide next generation ICs. One way to quickly do this is to reuse existing technology (e.g., designs) as much as possible to build new silicon systems.

With regard to viable methods for reuse, several are available. For example, a very high-speed IC hardware description language (VHDL) can be used to re-synthesize the circuit, or one can reuse an existing design layout and migrate the layout as it is to new process parameters and constraints. Further elaborating, a design reuse methodology based on migration employs hard intellectual property (IP) design. If reuse of soft and hard IP are compared on a value scale, hard IP is superior because all work for verification and simulation have already been done, and the is already proven as operational in silicon. Such hard IP design will most likely work successfully again if carefully migrated to any next sub-micron process. As a result, engineering time and talent required for reusing hard IP and migrating it to a target process technology will be significantly lower as opposed to building from scratch, or even using soft IP.

As a further advantage of hard IP reuse, the IC design centers and manufacturers can also use the opportunity to further tweak and optimize a hard IP layout during the migration process, e.g, tweak for improved power output, speed (e.g., from 700 MHz to 1 GHz) and more efficient wafer real estate usage (e.g., 30% size reduction). All types of semiconductor circuits and systems can be migrated, for example, microprocessor cores, digital signal processors (DSPs), data path designs, random-access memories (RAMs), read-only memories (ROMs), standard-cell libraries, complete chips, etc.

Based upon the above advantages, the present invention focuses on providing improvements in hard IP reuse arrangements (e.g., apparatus and methodologies) that enable ease and speed in reuse and optimization of hard IP for deep-submicron design., i.e., improvement arrangements for migrating and reusing legacy designs.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

[IN ORDER TO GUARANTEE CLARITY OF ONES OF THE ORIGINALLY SUBMITTED BLACK-AND-WHITE DRAWINGS, ENCLOSED HEREWITH AND FORMING PART OF THE ORIGINAL DISCLOSURE OF THIS APPLICATION, ARE COLOR COPIES OF ONES OF THE DRAWING FIGS. FOR THE PURPOSE OF ENHANCING A CLARITY OF THE DRAWINGS UNTIL PROPERLY CROSS-HATCHED FORMAL DRAWINGS CAN BE PREPARED; WITHIN SUCH COLOR DRAWINGS, PINKISH AREAS REPRESENT DIFFUSION AREAS, REDDISH-ORANGE AREAS REPRESENT METAL1 AREAS, BLUISH AREAS REPRESENT POLYSILICON AREAS, YELLOWISH AREAS REPRESENT CONTACTS CONNECTING DIFFUSION TO METAL, AND BLUISH/PINKISH (POLYSILICON/DIFFUSION) OVERLAP AREAS REPRESENT AREAS WHERE ACTIVE GATES OF TRANSISTORS RESIDE.]

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges/materials may be given, although the present invention is not limited to the same. Well known power/ground connections or other Ics layout components may not be shown within the FIGS. for simplicity of illustration and discussion, and so as not to obscure the invention. Further, arrangements may be shown in block or simplistic diagram form in order to avoid obscuring the invention, and also in view of the fact that specifics with respect to implementation of such diagram arrangements are highly dependent upon the platform within which the present invention is to be implemented, i.e., such specifics should be well within purview of one skilled in the art. Where specific details (e.g., arrangements, layouts, flowcharts) are set forth in order to describe example embodiments of the invention, it should be apparent to one skilled in the art that the invention can be practiced without, or with variation of, these specific details. Finally, it should be apparent that differing combinations of hardware and software instructions can be used to implement embodiments of the present invention, i.e., the present invention is not limited to any specific combination of hardware and software.

Although a background and examples embodiments of the invention will be described in example layouts in the context of example metal oxide semiconductor (MOS) and very large scale integration (VLSI), practice of the present invention is not limited thereto, i.e., practice of the present invention may be made in other types of technologies and other types of layouts.

Turning now to further discussion of reuse technologies, in order to migrate an original layout to a new layout, migration tools such as a "compactor" have been developed, and compactor products/services are offered by companies such as: Sagantec North America, located in Fremont, Calif. and found at the website www.sagantec.com; and, Rubicad Corp., located in San Jose, Calif., and found at the website www.rubicad.net. Elaborating, a compactor migrates legacy hard IP to new more compact hard IP in accordance with predetermined parameters (e.g., new or target process design rules, and user constraints).

Figure 1:
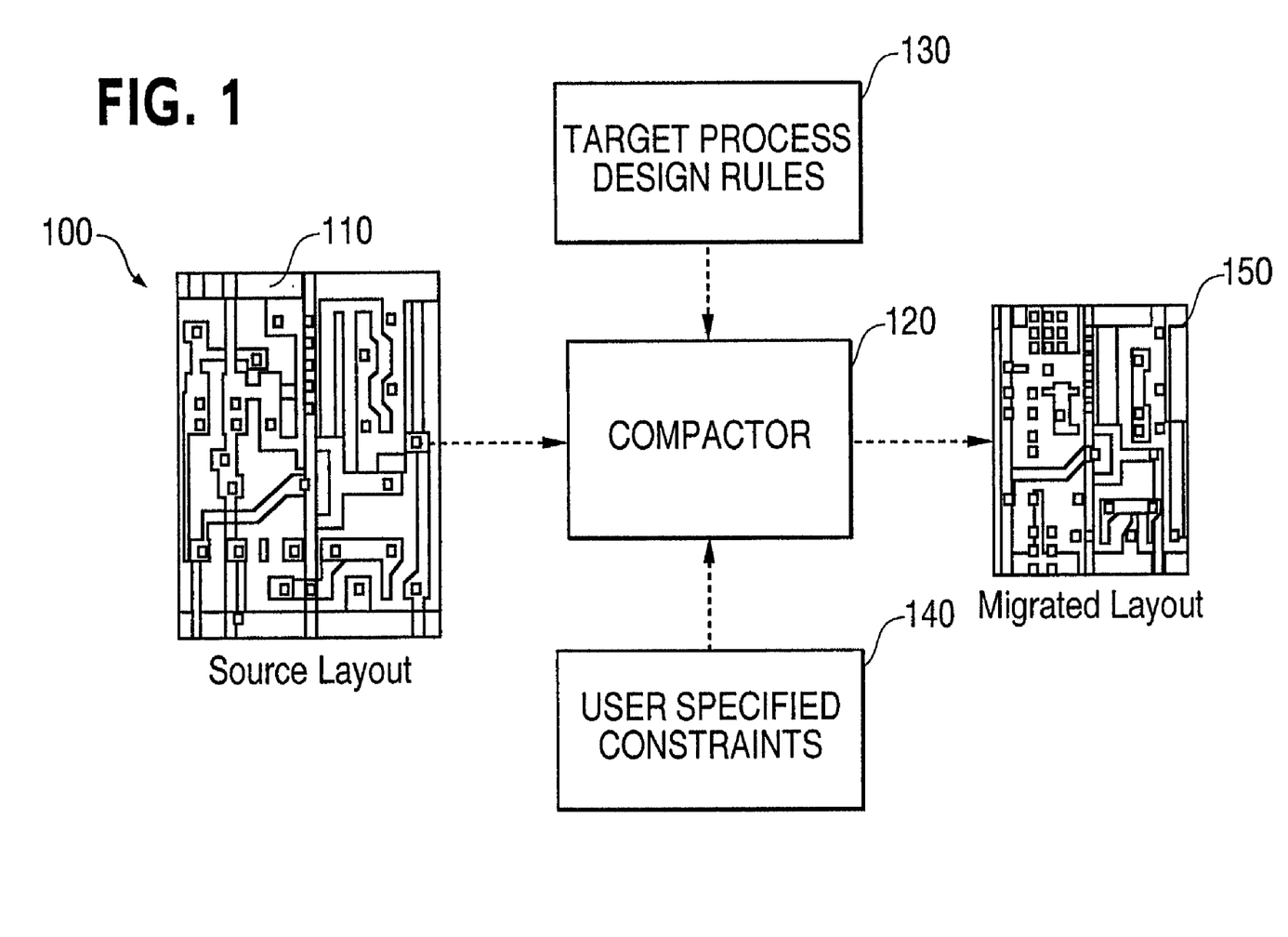
FIG. 1 illustrates an example migration arrangement (including an example compactor) in simplistic form, such FIG. being useful in explanation and understanding both background and example embodiments of the present invention.

FIG. 1 illustrates an example migration arrangement 100 (including an example compactor) in simplistic form, such FIG. being useful in explanation and understanding both background and example embodiments of the present invention. More specifically, shown is a source layout 110 fed to a compactor 120. The source layout 110 can be of any type of suitable code, for example, a non-exhaustive listing including Verilog or VHDL code. The compactor 120 further takes into consideration target process design rules 130 as well as user-specified constraints 140, and migrates the source layout 110 to a migrated layout 150 which is more compact and which complies with the inputted rules and constraints.

Historically, IC design centers and manufacturers initially used a linear migration or linear shrink method in attempts to scale designs to a latest process technology (e.g., from 0.25 µm technology to 0.18 µm). However, the linear technique subsequently proved to have limited use, mainly because oftentimes operation of smaller-and-smaller (e.g., deep sub-micron) IC structures/components do not change in a linear way. For example, in reducing a layout, decreasing line width results in increased interconnect resistance in the reduced IC, and decreasing interline separations results in increased interconnect capacitance. Accordingly, oftentimes, power and signal lines need to be adjusted in width and distance during migration to solve speed, cross-talk, and power problems. Thus, during migration, there may be the need for selective non-linear adjustment of various geometric structures.

One geometric structure which may be a candidate for non-linear adjustment is that of transistors. More particularly, it has be found that it may be desirable for a number of reasons to adjust the size of various transistors being migrated to the new layout design. While transistor resizing may involve either downsizing or up-sizing of transistor size, the present invention will be described in the context of transistor up-sizing, although practice of the present invention is not limited thereto. Further, while example embodiments of the present invention are described in the context of transistors, practice of the present invention is not limited thereto, i.e., the present invention may have uses migrating other types of devices or structures.

Turning now to a brief description of transistor up-sizing, such may be desirable, for example, because, owing to the aforementioned increased interconnect resistance and increased interconnect capacitance (from layout migration/reduction), a linearly-migrated transistor may have insufficient power within a migrated design, unless the transistor is up-sized. That is, since a smaller-sized (linear migrated) transistor has lesser power output capabilities, and since a further portion of this reduced transistor output power may now be absorbed by increased interconnect resistances/capacitances, particular transistors may cease to provide sufficient power in a migrated layout when migrated in a linear fashion.

As a second example, as mentioned previously, often during layout migration to the latest ultra-deep-submicron technology, there is a goal to improve an operational speed and power output of at least portions of the original layout, so as to realize an improved semiconductor chip product and hopefully improved operation and sales. Within upper limits, the speed and output power of an individual transistor increases generally linearly with the increase in size of the transistor. For example, if a transistor is tripled in size, it may be tripled in speed.

While it may be desired to increase a size of some transistors during layout migration, as alluded to above, certain limitations apply with simple transistor resizing (i.e., simple magnifying of the size/structures of the transistor) in that layout can accommodate simple transistor up-sizing only up to a certain limit before degraded transistor performance and/or failure occur. For example, sub-micron technologies of 0.13 µm size and below inherently impose strict constraints on the maximal size of a transistor leg size. For instance, moving from 0.13µ technology to 0.10µ may require a two times reduction of maximum transistor leg size due to a dramatic increase of poly resistance, i.e., growth beyond the leg size limit will degrade the speed of the transistor device due to poly resistance. This, in turn, may unacceptably degrade the operational speed of the entire migrated IC product. Still further, if the normal limits of the leg size for the transistor are exceeded via excessive simple magnification, layout geometries may overlap neighboring structures in the produced semiconductor circuit, which in turn may cause electrical failure (e.g., short-circuits and open-circuits). In summary, transistor resizing needed is now often more aggressive than the simple transistor resizing allows.

One solution to transistor size limitations is "relegging", by cutting up or duplicating the transistors into a plurality of parallel "legs" which thus work in tandem so as to effectively resize an original transistor. That is, re-legging is advantageous over simple transistor resizing in that it allows much more aggressive resizing of transistors, and allows a layout to achieve a transistor performance attempted to be achieved. Further, re-legging in parallel avoids excessive leg size so as to avoid speed degradation due to poly resistance.

Another usage of re-legging is to better utilize the area of a migrated layout. Assume the case where the pitch of a bit in a data path block must increase in the migrated layout due to more data lines passing through it, while the underlying logic of the bit does not change. Significant area waste may result because data lines now govern the width of the bit. The height is still governed by the underlying transistors, which height relates directly to the size of transistor legs. Significant area saving could be achieved by trading off height of the bit with its width. Re-legging of larger legs helps accomplish this.

Despite its attractiveness, a problem with re-legging is that it is a complex and tedious procedure. More particularly, re-legging involves the smashing of the original layout via tremendous art work (layout) changes and the pushing of many layout objects to make room for additional legs, . . . such is a very slow and tedious task. Significant resources (e.g., designers) are required. Thus far, there has been very little, if any, development of re-legging tools in the art, for example, while compactor tools have greatly matured, there has been no corresponding level of development with respect to re-legging tools. Accordingly, at present, any re-legging during layout migration is required to be accomplished manually requiring significant (unacceptable) resources and delays. Thus, re-legging is done only very selectively (only a very few legs) in any migration, if at all.

Continued and advancing migration of layout into more smaller-and-smaller advanced technology comprising smaller feature size is expected to greatly increase demand for enormous device resizing which can be realized only with re-legging. This disclosure is directed to realizing arrangements allowing re-legging of devices such as transistors in a convenient automatic or algorithmic manner and at high speed. More particularly, this disclosure is directed to the development of automatic or algorithmic re-legging tools.

Figure 2:
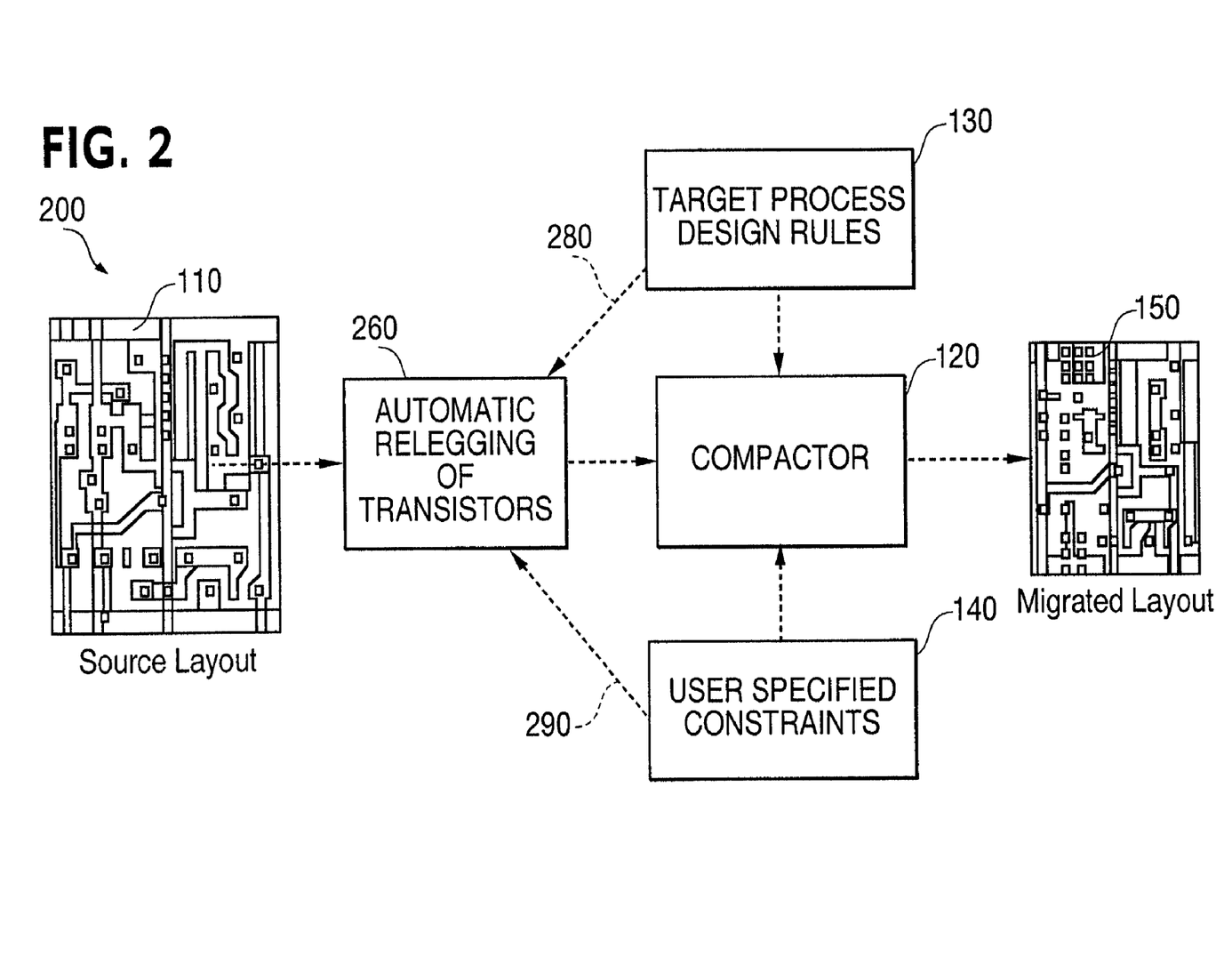
FIG. 2 illustrates an example migration arrangement similar to FIG. 1, but further including an example automatic re-legging arrangement of the present invention in simplistic form, such FIG. being useful in explanation and understanding example embodiments of the present invention.

In beginning to introduce discussion thereof, FIG. 2 illustrates an example migration arrangement similar to FIG. 1, but further including an example automatic re-legging arrangement of the present invention in simplistic form, such FIG. being useful in explanation and understanding example embodiments of the present invention. That is, FIG. 2 (similar to FIG. 1) illustrates an example embodiment of a simplistic migration arrangement 200 according to the present invention, wherein the FIG. 1 arrangement has been modified to insert an automatic re-legging arrangement 260 between the source layout 110 and the compactor 120. Further, it is noted that the automatic re-legging arrangement 260 may be arranged to consider information from the target process design rules 130 (as indicated by the FIG. 2 dashed arrow 280) and the user specified constraints 140 (as indicated by the FIG. 2 dashed arrow 280).

The automatic re-legging arrangement 260 (as well as any other sub-arrangement or re-legging operation discussed ahead), may be provided via any hardware and/or software combination. For example, it may be implemented purely via hardware (e.g., hardwired circuits), implemented via a hardware/software combination (e.g., an appropriately programmed electronic machine such as a computer), or purely as software provided on a machine readable medium. Hereinafter, such diverse implementation capability will be implied when appropriate, via the simply use of a "(implemented via any hardware and software combination)" parenthetical phrase.

Figure 3:
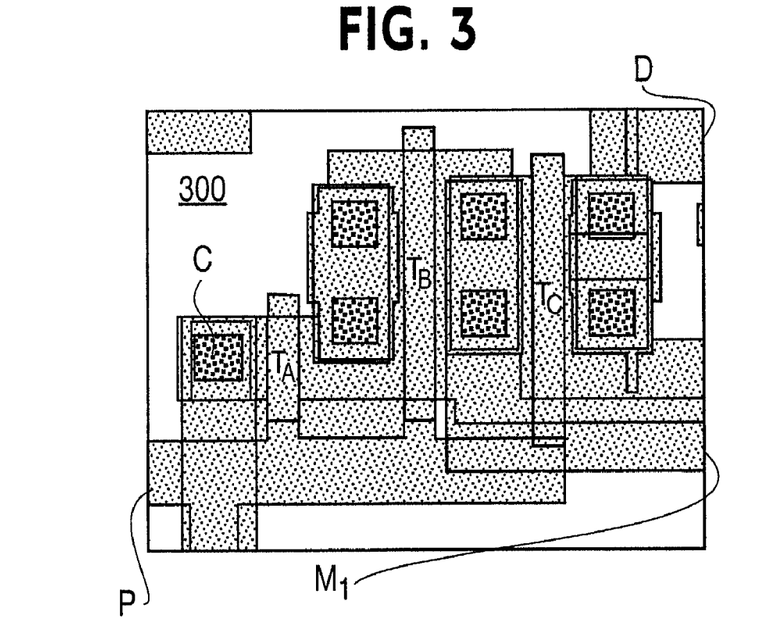
FIGS. 3–6 are useful in explanation and understanding of example embodiments of the present invention, and illustrate simplistic example virtual layouts of an example transistor re-legging operation from original source layout through a re-legged layout, compaction and a final migrated layout.

Before continuing discussion with particulars of the 260 arrangement, it is useful at this point to graphically illustrate re-legging. That is, turning discussion now to FIGS. 3–6, such FIGS. are useful in explanation and understanding of example embodiments of the present invention and illustrate simplistic example virtual layouts of an example transistor re-legging operation from original source layout through a re-legged layout, then compaction and a final migrated layout. More specifically, FIG. 3 illustrates a cell or small portion 300 of an original layout, which cell contains diffusion areas D, metal1 areas M1, polysilicon areas P, and contacts C connecting diffusion to metal. Three transistors $T_A$, $T_B$, $T_C$ defined by gate areas are formed within the example FIG. 3, at intersecting areas of polysilicon/diffusion.

Figure 4:
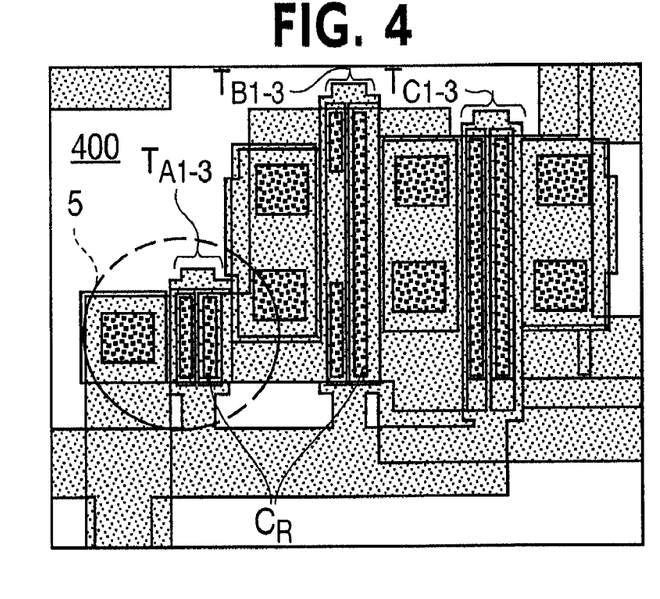

During migration of the example cell using an example embodiment of the present invention, FIG. 4 shows a re-legged layout 400 where each of the three transistors $T_A$, $T_B$, $T_C$ have been re-legged to have, for example, three legs (or transistors). More particularly, transistor $T_A$ has been re-legged into legs $T_{A1-3}$, transistor $T_B$ has been re-legged into legs $T_{B1-3}$, and transistor $T_C$ has been re-legged into legs $T_{C1-3}$. In addition, an appropriate number of re-legging contacts $C_R$ have been added between respective legs of each transistor, so as to retain proper electrical connectivity.

Figure 5:
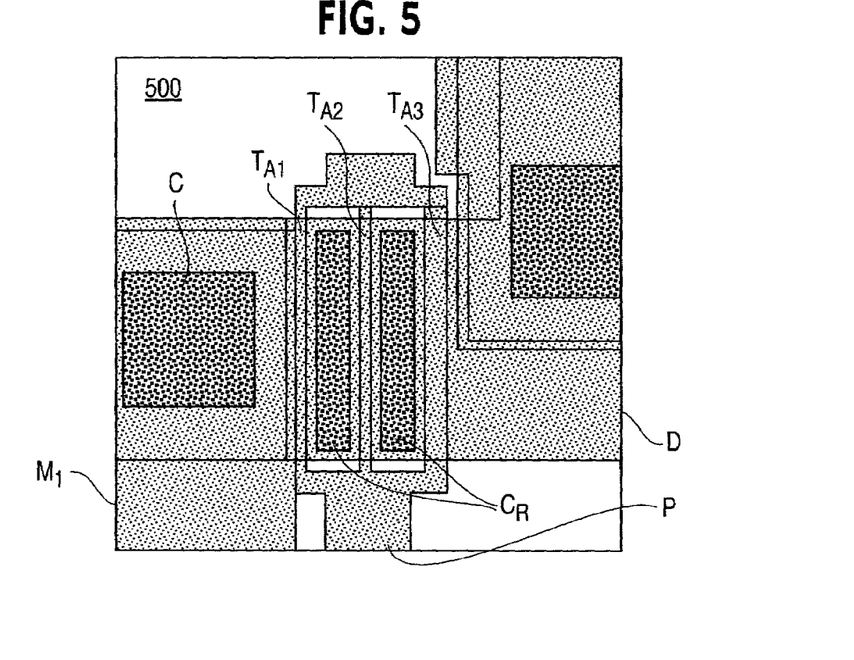

To add further clarity/understanding to the above, a FIG. 4 encircled area 5 is shown in magnified form in FIG. 5 as a magnified re-legged layout 500. More specifically, an example transistor $T_A$ is more clearly illustrated as re-legged into legs $T_{A1}$, $T_{A2}$, $T_{A3}$, and two re-legging contacts $C_R$ are more clearly illustrated as having been inserted between the legs.

One interesting aspect to note with respect to FIG. 4, is a comparison between the third and fourth re-legging contacts $C_R$ from the left. More particularly, whereas the fourth re-legging contact is a singular elongated re-legging contact, the third re-legging contact has been broken into two shorter re-legging contacts. A reason for this is to avoid potential electrical interference (e.g., short-circuiting) between the re-legging contacts and a closely neighboring semiconductor structure (e.g., a metal M1 edge). A similar situation will become more clearer in connection with description of FIG. 12 ahead.

At this point, it is useful to note that the FIGS. 4–5 re-legged layouts exist only in the virtual world as data and images on a display screen. More particularly, while the re-legged layout can be defined, for example, mathematically via values, vectors, etc. stored in a computer file, and while the re-legged layout can be viewed (even in magnified form) on a display screen, the FIGS. 4–5 layout is not a manufacture-able layout in its present form. More specifically, at minimum, the legs (e.g., $T_{A1}$, $T_{A2}$, $T_{A3}$) and the re-legging contacts CR have layout dimensions which are either beyond manufacturing capabilities (e.g., accuracy and tolerances), or not an efficient layout to provide satisfactory results. In short, the FIGS. 4–5 re-legged layout violates design rules and manufacturing capabilities. What is being done with such re-legging approach is to build (i.e., force) illegal devices/structures (i.e., transistor legs and re-legging contacts) into the source layout, and then have a compactor perform necessary corrections, e.g., recognize the illegal devices/structures and use its compaction tools both to modify the illegal devices/structures into compliant devices/structures, and to adjust the layout so to fit the compliant devices/structures into recaptured real estate. More particularly, by compliant devices/structures it is meant that the compacted devices/structures comply with target process design rules and user-specified constraints, and are manufacture-able.

Figure 6:
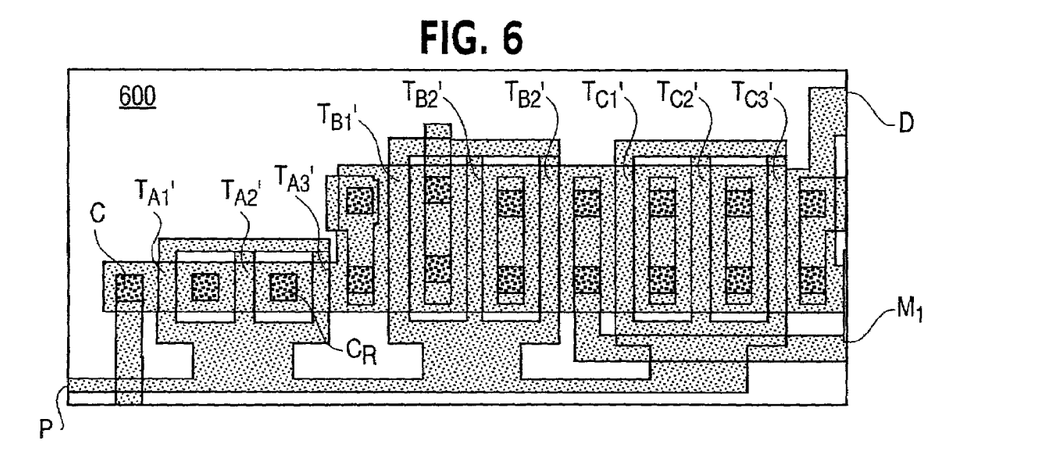

Continuing the example illustration and discussion, FIG. 6 shows a migrated layout 600 wherein the split legs and re-legging contacts (as well as all other original devices/structures) have been compacted into a compliant layout. More particularly, at minimum, shown are the original three transistors $T_A$, $T_B$, $T_C$, compacted into nine migrated transistors $T_{A1}'$, $T_{A2}'$, $T_{A3}'$, $T_{B1}'$, $T_{B2}'$, $T_{B3}'$, $T_{C1}'$, $T_{C2}'$, $T_{C3}'$, as well as their corresponding re-legging contacts $C_R$. Thus, the migrated/compacted layout including the transistors and contacts is a manufacture-able layout.

FIGS. 7–14 are useful in explanation and understanding of further features of example embodiments of the present invention, and illustrate simplistic example virtual layouts of another example transistor re-legging operation from original source layout through a re-legged layout. More particularly, FIGS. 7–14 will now be used to walk through an example embodiment of the present invention wherein re-legging operations (prior to compaction) are performed at least partially automatically.

Figure 7:
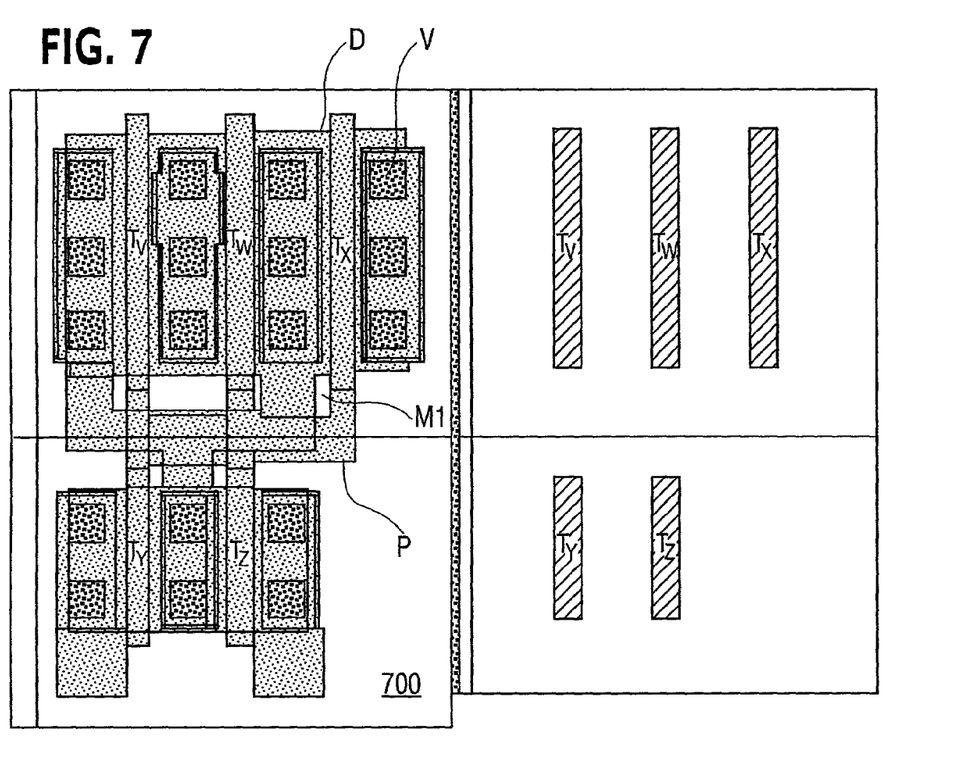
FIGS. 7–14 are useful in explanation and understanding of further features of example embodiments of the present invention, and illustrate simplistic example virtual layouts of another example transistor re-legging operation from original source layout through a re-legged layout; and, FIG. 15 illustrates example method steps for automatically implementing re-legging according to an example embodiment of the present invention.

More specifically, FIG. 7 illustrates a small cell or portion 700 of an original layout, which cell also (similar to FIGS. 3–6) contains diffusion areas D, metal1 areas M1, polysilicon areas P, and contacts C connecting diffusion to metal. Five transistors $T_V$, $T_W$, $T_X$, $T_Y$, $T_Z$ are formed approximately at intersecting areas of polysilicon/diffusion, and a right-hand portion of FIG. 7 is a simplified version of the FIG. 7 left-hand portion so as to solely illustrate the active gates of such five transistors for clarity. As one non-limiting example, the upper $T_V$, $T_W$, $T_X$ transistors may represent P-type devices, whereas the lower $T_Y$, $T_Z$ transistors may represent N-type devices.

Figure 8:
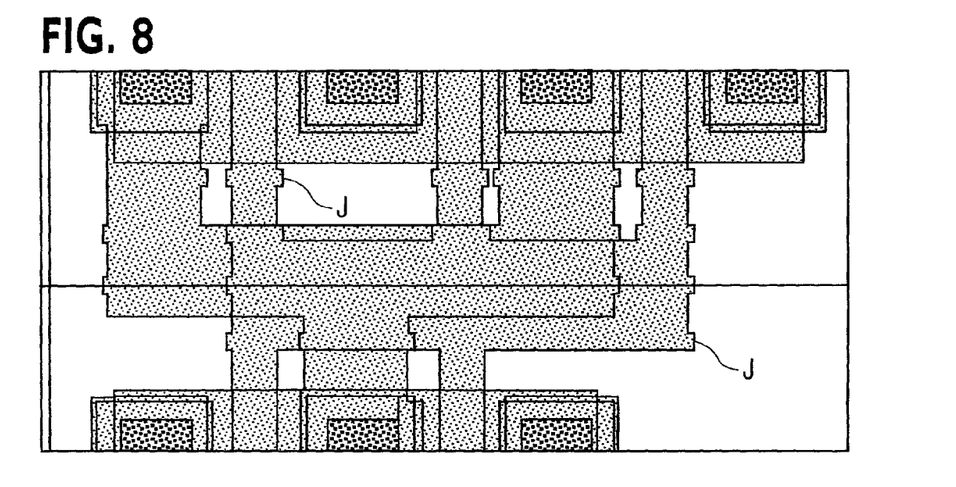

As shown in the figures, poly and metal straps connect P and N transistors. Since re-legging requires significant exercising of the layout, it may be desirable that the straight straps be broken by jogs. Otherwise, the compactor that aims at stretching the layout may stack or improperly compact ones of the structures. FIG. 8 depicts jogs or bumps J put in between the P and N devices of the cell. Such jogs or bumps J may (in the future) already be built in as part of an original source layout in situations where possible reuse is anticipated at the time of original layout design. Alternatively, the automatic re-legging arrangement 260 may contain a jog sub-arrangement (implemented via any hardware and/or software combination) which automatically analyzes the source layout and inserts appropriate jogs.

Figure 15:
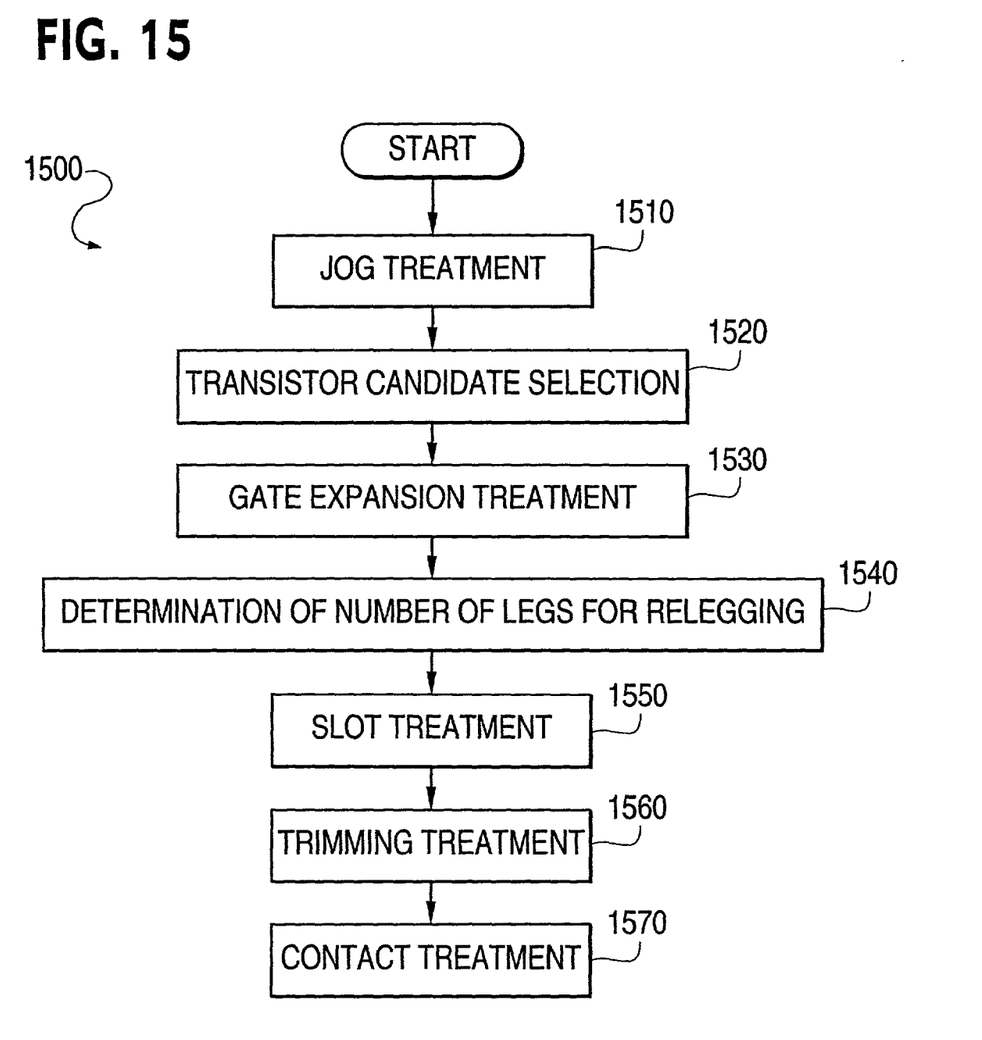

FIG. 15 illustrates example method steps for automatically implementing re-legging according to an example embodiment of the present invention, including the above operation. More particularly, the jog sub-arrangement implements jog operations with respect to the jog treatment block 1510. As non-exhaustive examples, jog locations may be automatically determined taking into consideration: the old design rules used to design the original source layout; the user-specified constraints 140 (as indicated by the FIG. 2 dashed arrow 290); the target process design rules 130 being used to design (i.e., compact) the layout (as indicated by the FIG. 2 dashed arrow 280); or, any combination thereof. The automatic re-legging arrangement 260 may also, or alternatively, allow a user to manually designate locations of individual jogs. As further example embodiments, jogs may be globally applied across an entirety of the source layout, or only selectively applied at localized sites of transistors which are candidates for re-legging. Further, jogs can be applied before, during or after transistor candidates are selected for re-legging, or any combination thereof.

Once jogs are created, transistors from the original source layout which are candidates for re-legging must be selected. More particularly, despite the conveniences of the present invention in easily facilitating re-legging, re-legging should still be applied somewhat conservatively or selectively, as there is a limitation as to how much wafer real estate can be recovered for use for additional transistor legs. That is, the compactor can successfully find real estate because not all devices are re-legged. As one example embodiment regarding selection, it is envisioned that the automatic re-legging arrangement 260 may contain a transistor-selection sub-arrangement (implemented via any hardware and/or software combination) which automatically analyzes the source layout and selects appropriate candidate transistors.

The transistor selection sub-arrangement implements transistor selection operations with respect to the FIG. 15 transistor candidate selection block 1520. For example, the transistor-selection sub-arrangement may analyze a lesser level of power output expected of a transistor (if linearly migrated) as well as a portion of the transistor output power that is expected to be absorbed by increased interconnect resistances/capacitances (in the anticipated migrated layout), to make a prediction as to whether the transistor (if linearly migrated) would be expected to operate adequately (e.g., at a predetermined threshold level). Further, the transistor-selection sub-arrangement may (as indicated by the FIG. 2 dashed arrow 290) take into consideration the user constraints 140 as to whether a transistor should be selected (i.e., flagged) as a candidate for re-legging. For example, user constraints 140 may specify a certain area (e.g., output driver area) of the source layout which is desired to be enhanced (e.g., for increased speed and/or power) in the migrated layout, whereupon all transistors within such area would be selected as candidates for re-legging. The automatic re-legging arrangement 260 may also, or alternatively, allow a user to manually designate individual or classes of transistors as candidates for re-legging. In the present FIG. 7 example, an assumed determination is that three out of the five transistors have been selected or flagged as candidates for re-legging, i.e., the left-most upper (P-type) transistor $T_V$, and the two bottom (N-type) transistors $T_Y$, $T_Z$.

In the present example embodiments, it is the active gate areas where re-legging operations are applied. Once transistor re-legging candidates have been selected, on occasions, it may be desirable to initially expand the active gate areas before re-legging is applied. That is, because the active gate areas may be very small making it difficult/inconvenient to apply re-legging, some active gate area expansion may be applied in the active gate areas of the transistors selected for re-legging. With regard to gate expansion, the automatic re-legging arrangement 260 may contain a gate-expansion sub-arrangement (implemented via any hardware and/or software combination) which automatically analyzes the source layout and expands appropriate gate areas of ones of the transistor re-legging candidates.

Figure 9:
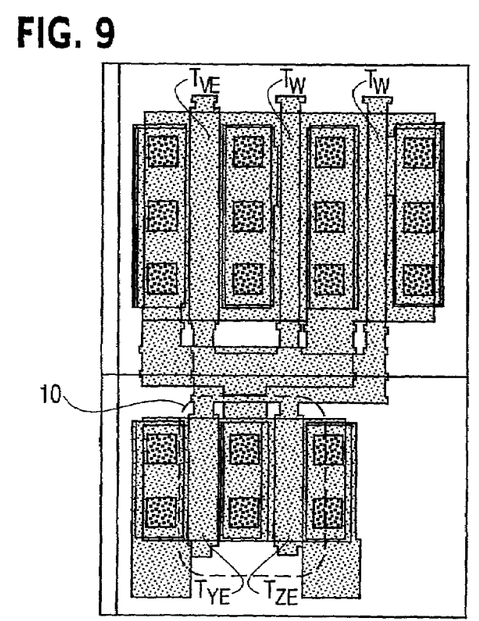

The gate-expansion sub-arrangement implements gate expansion operations with respect to the FIG. 15 gate expansion treatment block 1510. As non-exhaustive examples, gate expansion candidates and/or gate expansion size may be automatically determined taking into consideration: the old design rules used to design the original source layout; the user-specified constraints 140 (as indicated by the FIG. 2 dashed arrow 290); the target process design rules 130 being used to design (i.e., compact) the layout (as indicated by the FIG. 2 dashed arrow 280); or, any combination thereof. The automatic re-legging arrangement 260 may also, or alternatively, allow a user to stipulate gate expansion candidates and/or gate expansion size. As further example embodiments, gate expansion may be globally applied for all transistor re-legging candidates, or only selectively applied for a lesser number of the transistor re-legging candidates. As a final note, care must be taken with gate expansion so as not to overlap neighboring layout structures so as to maintain proper electrical isolation (i.e., avoid short-circuiting in the final migrated layout). With the foregoing in mind, FIG. 9 illustrates a gate-expanded layout where all three of the transistor re-legging candidates have expanded gate areas, i.e., $T_{VE}$, $T_{YE}$, $T_{ZE}$, whereas the other transistor areas $T_w$, $T_x$ do not. Note the difference in the size of the gates aimed at re-legging and those that are not.

In addition to gate-expansion decisions, it must additionally be decided how many legs a transistor should be split into. Several factors affect the decision whether to re-leg a single leg, and how many legs a transistor should be split into. A non-exhaustive listing of appropriate factors are summarized and described as follows:

Maximal leg length. Given that technology may restrict the maximum size of an individual transistor leg, any leg of transistor re-legging candidates in the source layout that needs to achieve some target size exceeding this limit must be split into a plurality of legs.

Achieving 100% up-size in ECOs. When the layout is device-limited, legs can hardly grow unless the migration involves extensive downsizing. Even for routing limited layouts, it may sometimes also be impossible to reach 100% up-sizing of legs. Re-legging of the source layout may alleviate this difficulty.

Pitch matching and area saving. As explained above, re-legging can produce efficient layout for migration involving pitch change of bits in data-path blocks. In some instances, only devices oriented in data-lines direction may be candidates for re-legging. Excessive re-legging may result in overflow of the underlying bit layout beyond the bit pitch. On the other hand, poor re-legging will not deliver enough area saving.

Evenness of legs. Re-legging consists of splitting an existing leg into a plurality of legs. Connecting all drains, sources and gates respectively preserves the connectivity of the new legs. Splitting one leg into three new ones (or into an odd number in general) makes the connection of the newly-created legs a much simpler task in comparison to a situation where evenness is not maintained. The latter case needs to break diffusions, which is generally a hard task. Therefore, in the present example embodiments, re-legging may be restricted to maintain leg evenness, although this may cause some waste of area.

Size of leg in source layout. Small legs in the source layout can usually absorb larger up-size factors than big ones. Therefore, the re-legging decision may advantageously take into account the original leg size and the up-sizing factor. The target leg size should be designed such that it will not exceed the target technology limit.

Following are example formula which can be used to decide on the number of new legs of device, according to example embodiment of the present invention:

$$N_{new} = \max\{N_{old}, \lceil (W_{old} \times f)/W_m \rceil\}$$

$N_{new}$—New number of legs.
$W_{old}$—Device width before resizing.
$N_{old}$—Old number of legs.
f—Upsize factor
$W_m$—Maximal leg size in new layout.

It is necessary to maintain the evenness of the number of legs, and therefore, such a requirement implies that an increase of the leg count must be in jumps of 2. Therefore, a correction of the above formula is in order. The actual number of legs in the new layout is therefore:

$$N_{new} = N_{old} + \lfloor (N_{new} - N_{old} + 1)/2 \rfloor \times 2$$

With regard to applying the example leg-splitting formulas, the automatic re-legging arrangement 260 may contain a leg-splitting-calculating sub-arrangement (e.g., via any combination of hardware and/or software) which obtains input of, for example, the above-indicated parameters, and automatically performs analysis for each transistor re-legging candidate, to determine a number and parameters of legs thereof. The leg-splitting-calculating sub-arrangement implements leg splitting operations with respect to the FIG. 15 determination of number of legs for re-legging block 1540. As further example embodiments, leg-splitting calculating may be performed individually for each transistor re-legging candidate, or alternatively, upon a predetermined consensus of calculations, calculating may be terminated and a majority re-legging leg number globally applied to all transistor re-legging candidates (e.g., if a majority (e.g., 60%) of calculations conducted thus far almost universally resulted in a three-leg split, then a three-leg split may be globally applied). The automatic re-legging arrangement 260 may also, or alternatively, allow a user to stipulate an "X"-leg split for any given transistor re-legging candidate.

Once the number of new legs for each transistor re-legging candidate in the layout is found, data (e.g., size) for every leg may be assigned and stored in a re-legged layout computer file. In the discussions to follow, it is assumed that it has been determined that each transistor re-legging candidate is to be split into three legs.

Figure 10:
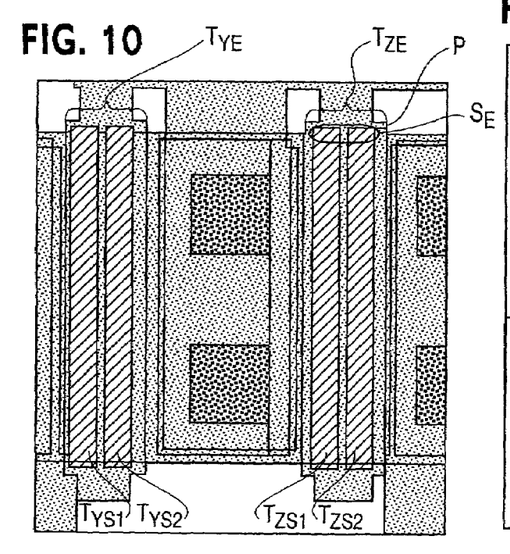
Figure 11:
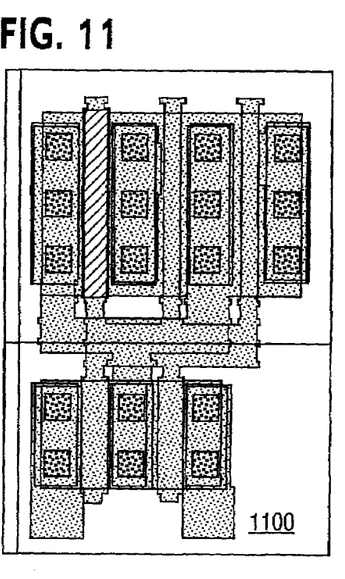

In beginning leg splitting to create new legs, slots may be first inserted into the layout upon gate areas of the transistor re-legging candidates. As one example, these slots are put on top of the expanded gates described above. As mentioned previously, in order to ease the re-connection of the newly-created gates, re-legging maintains the evenness of the legs. Every leg which is candidate for re-legging in the present example, therefore, has two slots defined thereon that will later cause splitting into three new legs. FIG. 10 is an enlarged view showing example illustration of such slots $T_{YS1}$, $T_{YS2}$ and $T_{ZS1}$, $T_{ZS2}$ formed with respect to the expanded gate areas $T_{YE}$, $T_{ZE}$, respectively, i.e., slot modification of the FIG. 9 dashed area 10. Notice that, in order to better guarantee a right topology of layout and electrical separation of the legs, the slots may extend beyond the area of diffusion as illustrated more clearly in FIG. 10's encircled slot extend area SE. FIG. 11 illustrates a non-enlarged slotted layout 1100 where a pair of slots has been place with respect to each of the aforementioned three transistor re-legging candidates.

With regard to slot placement/sizing, the automatic re-legging arrangement 260 may contain a slot placement/sizing sub-arrangement (implemented via any hardware and/or software combination) which automatically analyzes the source layout and determines appropriate placement and size of the slots with respect to gate areas of the transistor re-legging candidates. The slot placement/sizing sub-arrangement implements slot operations with respect to the FIG. 15 slot treatment block 1550. As non-exhaustive examples, slot placement/sizing may be automatically determined taking into consideration: the old design rules used to design the original source layout; the user-specified constraints 140 (as indicated by the FIG. 2 dashed arrow 290); the target process design rules 130 being used to design (i.e., compact) the layout (as indicated by the FIG. 2 dashed arrow 280); the location and size of the original or expanded gate areas, or, any combination thereof. The automatic re-legging arrangement 260 may also, or alternatively, allow a user to stipulate slot placement/sizing. As further example embodiments, a particular slot placement/sizing may be globally applied for all transistor re-legging candidates, or only selectively applied for a lesser number of the transistor re-legging candidates.

Figure 12:
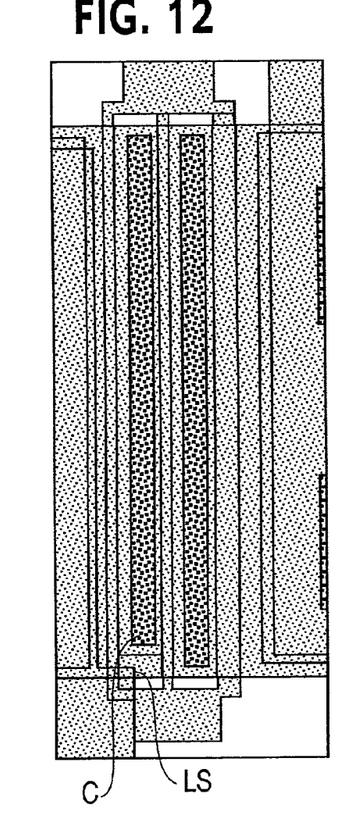
Figure 13:
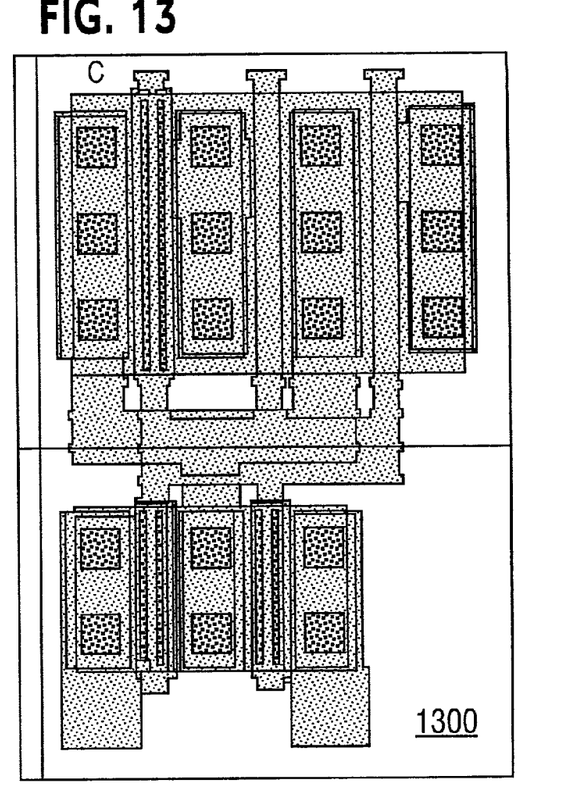
Figure 14:
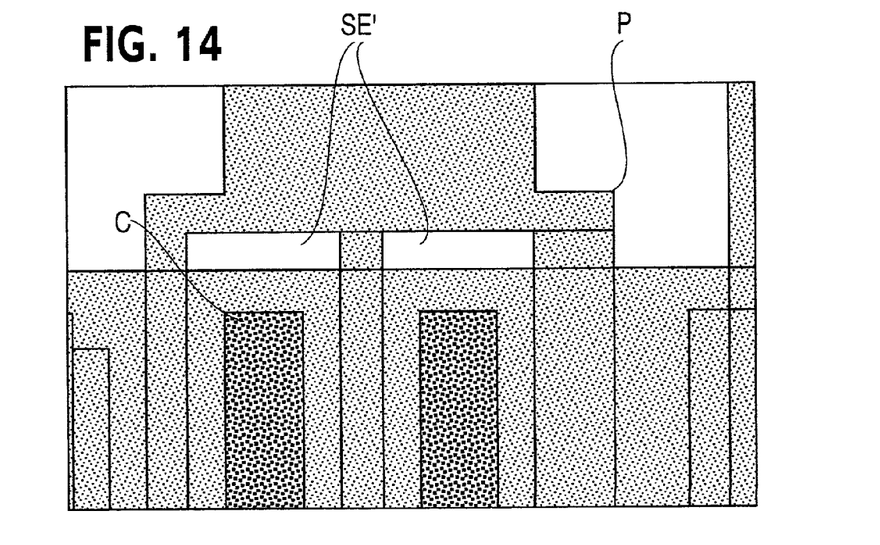

Discussion turns next to trimming of poly under the slots and also contact preparations. More particularly, once slots are defined by the above procedures, they are mathematically or arithmetically subtracted from the poly-silicon layer. Thus, an original normal leg is turned into a plurality of (e.g., three) thin legs connected in parallel. Trimming the poly-silicon leaves two uncovered diffusions between adjacent legs which is in the source node (and drain node) of two legs connected together. Assume that the source node is left as uncovered diffusion. It then must be connected to the right side of the original leg. In a similar way, the right uncovered diffusion, which is now the drain node, must be connected to the left side of the original leg. In order to ease this task, seeds of contacts covered by metal pads are implanted in the uncovered diffusion area. FIG. 12 shows an enlarged view with respect to trimming and contact placement/sizing of the FIG. 10 slots $T_{YS1}$, $T_{YS2}$. Of particular interest, note that while the two FIG. 12 slots have been illustrated unequally trimmed in length, i.e., a FIG. 12 left-hand contact C is shorter in length that a right-hand contact. A reason for this (similar to the reason as in FIG. 4) is to avoid potential electrical interference (e.g., short-circuiting) between the re-legging contact seeds and a closely neighboring layout structure LS (e.g., a metal M1 edge). FIG. 13 illustrates a non-enlarged re-legged layout 1300 where trimming has been completed and a pair of contacts has been placed with respect to each of the aforementioned three transistor re-legging candidates. Finally, FIG. 14 show an enlarged view of only an upper portion of the FIG. 10 slots $T_{ZS1}$, $T_{ZS2}$, for the purpose of showing that, upon subtraction of the slot's extend area SE from the poly-silicon layer P, the original leg is split into three legs cleanly isolated by the resultant voided (i.e., subtracted) extend area SE'. The result of all of the foregoing is that candidate transistors are re-legged in such a way that gate, source and drain connectivity are maintained.

With regard to trimming and contact preparations, the automatic re-legging arrangement 260 may contain a trimming/contact sub-arrangement (implemented via any hardware and/or software combination) which automatically analyzes the layout and determines appropriate trimming and contact placement/sizing with respect to slotted/trimmed areas of the transistor re-legging candidates. The trimming/contact sub-arrangement implements trimming/contact operations with respect to the FIG. 15 trimming treatment block 1560 and contact treatment block 1570. As non-exhaustive examples, trimming/contact determinations may be automatically determined taking into consideration: the old design rules used to design the original source layout; the user-specified constraints 140 (as indicated by the FIG. 2 dashed arrow 290); the target process design rules 130 being used to design (i.e., compact) the layout (as indicated by the FIG. 2 dashed arrow 280); the location and size of the original or expanded base/slot areas, or, any combination thereof. The automatic re-legging arrangement 260 may also, or alternatively, allow a user to stipulate trimming and/or contact placement/sizing. As further example embodiments, a particular trimming directive and determined contact placement/sizing may be globally applied for all transistor re-legging candidates, or only selectively applied for a lesser number of the transistor re-legging candidates.

The result of all of the above is a re-legged layout 1300 (FIG. 13) automatically determined and outputted from the FIG. 2 automatic re-legging arrangement 260, and suitable for input to the compactor 120. As mentioned previously, such re-legged layout exists only in the virtual world as data and images on a display screen. More particularly, all the above geometric manipulation, though creating electrically-correct layout topology, is not in compliance with the target process design rules 130. Thus, the re-legging layout 1300 is illegal for manufacturing. As mentioned previously, it is the role of a compaction engine to return the layout into proper dimensions, obeying all technology rules.

In initiating summary, the present invention has the following advantages:

Can handle any number of re-legging.
No smashing is needed, hierarchy is fully maintained.
Can be coded in software, thus enabling to automate the entire process.
The newly created layout is correct by construction.
It enables aggressive speed-up by resizing.
It enables to automatically adjust pitch of bits in data-path layout.
It enables extensive layout speed-up by resizing, which otherwise could hardly be done, or couldn't at all.
It will accelerate the ECO process, thus shortening tape-out latency.
Will open more opportunities for proliferation and reuse of layout IP.
Will enable better area-performance tradeoff.
Will save PD resources.

As further summary, this invention automates the layout practice of leg duplication in layout, while maintaining device leg evenness. The automation may be made by three major components:

Dedicated software, which preprocess the source layout.
Employment of any compactor to resolve DRC violation occurring by above preprocesses.
Integration in a flow which handles simultaneously the proper adjustment of device sizing.

Finally, to summarize in terms of simplistic language, the present invention is basically using an automatic or algorithmic approach and is taking an original design implemented in one technology (e.g., 0.18 microns), deciding which transistors are candidates for re-legging, splitting the candidate transistors while maintaining proper electrical connection (i.e., avoiding short-circuits and open circuits and interference overlap with other devices) while not necessarily maintaining proper design rules (non-manufacture-able), then sending the re-legged design through a "compactor" which will maintain the proper electrical connections while at the same time coming up with a design which complies with proper design rules, i, e., a valid manufacture-able design.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, while example embodiments (e.g., FIG. 2) have been described wherein the automatic re-legging arrangement 260 was provided separately and inserted in between the source layout 110 and the compactor 120, the automatic re-legging arrangement 260 may be provided a differing point in any migration process and may be provided as part of the compactor 120 rather than being separately provided. Further, the FIG. 15 blocks may be implemented in an order differing from the order depicted.

What is claimed is:

1. A method using a computer comprising:
    adding legs to a transistor in a source layout to create a re-legged layout that violates design rules; and
    performing compaction to modify the re-legged layout to comply with the design rules;
    wherein adding legs to a transistor comprises forming a plurality of slots in a gate of the transistor.

2. The method of claim 1 further comprising expanding the gate of the transistor prior to forming the plurality of slots.

3. The method of claim 1 further comprising placing contact seeds in areas uncovered by the plurality of slots.

4. A method using a computer comprising:
    adding legs to a transistor in a source layout to create a re-leaged layout that violates design rules:
    performing compaction to modify the re-legged layout to comply with the design rules; and
    determining a number of legs to add to the transistor according to:

$$N_{new} = \max\{N_{old}, \lfloor (W_{old} \times f)/W_m \rfloor\}$$

$N_{new}$—New number of legs.
$W_{old}$—Device width before resizing.
$N_{old}$—Old number of legs.
f—Upsize factor
$W_m$—Maximal leg size in new layout.

5. The method of claim 4 wherein determining a number of legs further comprises correcting the number of legs to add an even number of legs according to:

$$N_{new(corrected)} = N_{old} + \lfloor (N_{new} - N_{old} + 1)/2 \rfloor \times 2.$$

6. A method using a computer comprising:
    adding legs to a transistor in a source layout to create a re-legged layout that violates design rules, wherein adding legs to a transistor in a source layout comprises adding legs to a transistor in a hard intellectual property (IP) layout source design; and
    performing compaction to modify the re-legged layout to comply with the design rules.

7. A method using a computer comprising:
    adding legs to a transistor in a source layout to create a re-legged layout that violates design rules;
    performing compaction to modify the re-legged layout to comply with the design rules; and
    adding jogs to the source layout.

8. A method using a computer to add legs to a transistor in a source layout comprising:
    inserting a plurality of slots into the layout upon a gate area of the transistor;
    mathematically subtracting area of the plurality of slots from a poly layer without regard to satisfying design rules; and
    placing contact seeds in diffusion areas uncovered by the subtracting, wherein the contact seeds are placed without regard to satisfying the design rules.

9. The method of claim 8 further comprising running an automated design tool on the source layout to modify dimensions of the transistor to satisfy the design rules.

10. The method of claim 9 wherein running an automated design tool on the source layout comprises running a compaction tool.

11. The method of claim 8 further comprising enlarging the gate area of the transistor prior to inserting a plurality of slots into the source layout.

12. The method of claim 8 further comprising determining a number of legs to add to the transistor according to:

$$N_{new} = \max\{N_{old}, \lfloor (W_{old} \times f)/W_m \rfloor\}.$$

$N_{new}$—New number of legs
$W_{old}$—Device width before resizing
$N_{old}$—Old number of legs
f—Upsize factor
$W_m$—Maximal leg size in new layout.

13. The method of claim 12 wherein determining a number of legs further comprises correcting the number of legs to add an even number of legs according to:

$$N_{new(corrected)} = N_{old} + \lfloor (N_{new} - N_{old} + 1)/2 \rfloor \times 2.$$

14. The method of claim 8 wherein adding legs to a transistor in a source layout comprises adding legs to a transistor in a hard intellectual property (IP) layout source design.

15. The method of claim 8 further comprising adding jogs to the source layout.

16. A machine-readable medium containing instructions, which when executed, cause the following to be performed:
    inserting a plurality of slots into a source layout upon a gate area of a transistor;
    mathematically subtracting area of the plurality of slots from a poly layer without regard to satisfying design rules; and
    placing contact seeds in diffusion areas uncovered by the subtracting, wherein the contact seeds are placed without regard to satisfying the design rules.

17. The machine-readable medium of claim 16 wherein the instructions, when executed, further cause a compaction tool to run on the source layout to modify dimensions of the transistor to satisfy the design rules.

18. The machine-readable medium of claim 17 wherein the instructions, when executed further cause determining a number of legs to add to the transistor according to:

$$N_{new} = \max\{N_{old}, \lfloor (W_{old} \times f)/W_m \rfloor\}$$

$N_{new}$—New number of legs
$W_{old}$—Device width before resizing
$N_{old}$—Old number of legs
f—Upsize factor
$W_m$—Maximal leg size in new layout.

19. The machine-readable medium of claim 18 wherein determining a number of legs further comprises correcting the number of legs to add an even number of legs according to:

$$N_{new(corrected)} = N_{old} + \lfloor (N_{new} - N_{old} + 1)/2 \rfloor \times 2.$$

* * * * *

UNITED STATES PATENT AND TRADEMARK OFFICE
CERTIFICATE OF CORRECTION

PATENT NO. : 7,079,989 B2
APPLICATION NO. : 09/893527
DATED : July 18, 2006
INVENTOR(S) : Wimer It is certified that error appears in the above-identified patent and that said Letters Patent is hereby corrected as shown below:

On the face page, in field (56), under "Other Publications", in column 2, line 3, delete "IEEE" and insert -- , IEEE --, therefor.

On the face page, in field (56), under "Other Publications", in column 2, line 6, delete "IEEE" and insert -- , IEEE --, therefor.

In column 13, line 33, in Claim 4, delete "re-leaged" and insert -- re-legged --, therefor.

In column 13, line 33, in Claim 4, delete "rules:" and insert -- rules; --, therefor.

In column 13, line 39, in Claim 4, delete "$N_{new} = \max\{N_{old}, \lfloor (W_{old} \times f)/W_m \rfloor\}$" and insert -- $N_{new} = \max\{N_{old}, \lceil (W_{old} \times f)/W_m \rceil\}$ --, therefor.

In column 14, line 19, in Claim 12, delete "$N_{new} = \max\{N_{old}, \lfloor (W_{old} \times f)/W_m \rfloor\}$" and insert -- $N_{new} = \max\{N_{old}, \lceil (W_{old} \times f)/W_m \rceil\}$ --, therefor.

In column 14, line 20, in Claim 12, after "legs" insert -- . --.

In column 14, line 21, in Claim 12, after "resizing" insert -- . --.

In column 14, line 22, in Claim 12, after "legs" insert -- . --.

In column 14, line 54, in Claim 18, delete "$N_{new} = \max\{N_{old}, \lfloor (W_{old} \times f)/W_m \rfloor\}$" and insert -- $N_{new} = \max\{N_{old}, \lceil (W_{old} \times f)/W_m \rceil\}$ --, therefor.

In column 14, line 55, in Claim 18, after "legs" insert -- . --.

In column 14, line 56, in Claim 18, after "resizing" insert -- . --.

UNITED STATES PATENT AND TRADEMARK OFFICE
CERTIFICATE OF CORRECTION

PATENT NO. : 7,079,989 B2
APPLICATION NO. : 09/893527
DATED : July 18, 2006
INVENTOR(S) : Wimer It is certified that error appears in the above-identified patent and that said Letters Patent is hereby corrected as shown below:

In column 14, line 57, in Claim 18, after "legs" insert -- . --.

Signed and Sealed this

Fourth Day of September, 2007

JON W. DUDAS
*Director of the United States Patent and Trademark Office*